United States Patent
Kim et al.

(10) Patent No.: US 8,092,698 B2
(45) Date of Patent: Jan. 10, 2012

(54) METHODS OF FORMING SEMICONDUCTOR DEVICES FORMED BY PROCESSES INCLUDING THE USE OF SPECIFIC ETCHANT SOLUTIONS

(75) Inventors: Yu-Kyung Kim, Busan-gwangyeoksi (KR); Chang-Ki Hong, Gyeonggi-do (KR); Sang-Jun Choi, Seoul (KR); Jeong-Nam Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 563 days.

(21) Appl. No.: 12/199,928

(22) Filed: Aug. 28, 2008

(65) Prior Publication Data

US 2008/0314868 A1    Dec. 25, 2008

Related U.S. Application Data

(62) Division of application No. 11/192,700, filed on Jul. 29, 2005, now abandoned.

(30) Foreign Application Priority Data

Aug. 3, 2004  (KR) ........................ 10-2004-0061227

(51) Int. Cl.
   *B44C 1/22*   (2006.01)
(52) U.S. Cl. ............................ 216/22; 216/102; 438/754
(58) Field of Classification Search .................... 216/22, 216/102, 106, 109; 438/745, 754, 755
   See application file for complete search history.

(56) References Cited

U.S. PATENT DOCUMENTS

| | | | |
|---|---|---|---|
| 6,319,801 B1 | 11/2001 | Wake et al. | |
| 6,426,012 B1 * | 7/2002 | O'Sullivan et al. | ............. 216/22 |
| 6,589,884 B1 | 7/2003 | Torek | |
| 6,620,215 B2 | 9/2003 | Li et al. | |
| 2002/0111024 A1 | 8/2002 | Small et al. | |
| 2002/0189169 A1 | 12/2002 | Costas et al. | |
| 2003/0209255 A1 | 11/2003 | Brown et al. | |
| 2003/0224958 A1 | 12/2003 | Andreas | |
| 2004/0035354 A1 | 2/2004 | Kneer | |
| 2004/0043624 A1 * | 3/2004 | Tsai et al. | ..................... 438/745 |
| 2007/0111532 A1 * | 5/2007 | Lee et al. | ..................... 438/745 |

FOREIGN PATENT DOCUMENTS

| | | |
|---|---|---|
| CN | 1274475 A | 11/2000 |
| CN | 1463010 A | 12/2003 |
| CN | 1476489 A | 2/2004 |
| JP | 58-021336 | 2/1983 |
| JP | 58-182832 | 10/1983 |
| JP | 61-276327 | 12/1986 |
| JP | 02-206117 | 8/1990 |
| JP | 07-041965 | 2/1995 |
| JP | 09-228075 | 9/1997 |
| JP | 11-162916 A | 6/1999 |
| KR | 1999-016917 A | 3/1999 |
| KR | 10-0287173 B1 | 1/2001 |
| KR | 2002-0075907 A | 10/2002 |
| WO | WO 01-57921 A1 | 8/2001 |

OTHER PUBLICATIONS

First Chinese Office Action (9 pages) corresponding to Chinese Patent Application No. 200510088504.4; Dated: Jun. 5, 2009.

* cited by examiner

*Primary Examiner* — Lan Vinh

(74) *Attorney, Agent, or Firm* — Myers Bigel Sibley & Sajovec, PA

(57) ABSTRACT

The present invention provides etchant solutions including deionized water and an organic acid having a carboxyl radical and a hydroxyl radical. Methods of forming magnetic memory devices are also disclosed.

11 Claims, 5 Drawing Sheets

METHODS OF FORMING SEMICONDUCTOR DEVICES FORMED BY PROCESSES INCLUDING THE USE OF SPECIFIC ETCHANT SOLUTIONS

CROSS-REFERENCE TO RELATED APPLICATION

The present application is a divisional application of and claims priority from U.S. patent application Ser. No. 11/192,700, filed Jul. 29, 2005, now abandoned which claims priority from Korean Patent Application No. 10-2004-61227, filed Aug. 3, 2004, the disclosures of which are incorporated herein by reference in their entireties as if set forth fully herein.

FIELD OF THE INVENTION

The present invention relates to etchant solutions and methods of forming semiconductor devices formed by processes including the same. More particularly, the present invention provides etchant solutions including deionized water and organic acids and methods of forming magnetic memory devices formed by processes including the same.

BACKGROUND OF THE INVENTION

Magnetic memory devices are promising candidates for novel alternative memory devices, in part, because of their non-volatile characteristics such as high-speed write and read operations, high integration density, and data rewritability capacity.

Conventional magnetic memory devices may employ a magnetic tunnel junction pattern (MTJ pattern) as a data storage unit. A digit and a bitline may be disposed under and over an MTJ pattern, respectively. The digit line and the bitline may intersect each other. Electric fields generated from the digit lines and the bitline may be applied to the MTJ pattern to vary the resistance of the MTJ pattern. The amount of current flowing through the MTJ pattern may vary with the variation of the resistance of the MTJ pattern. The variation of the amount of current flowing through the MTJ pattern may be sensed in order to judge whether information stored in a unit cell of a magnetic memory device is logic "1" or "0".

An MTJ pattern may include two magnetic substances and a tunnel barrier layer interposed therebetween. The resistance of the MTJ pattern may vary with magnetization directions of the magnetic substances. That is, a resistance R1 of the MTJ pattern may be lower than a resistance R2 ("R1" being a resistance of the MTJ pattern when the magnetization directions of the magnetic substances are identical to each other, and "R2" being a resistance of the MTJ pattern when the magnetization directions thereof are different from each other).

A conventional method of forming an MTJ pattern is described with reference to FIG. 1. Specifically referring to FIG. 1, an insulation layer 2 is formed on a semiconductor substrate 1. A bottom magnetic layer, a tunnel barrier layer and a top magnetic layer are sequentially formed on the insulation layer 2. A photoresist pattern 7 is formed on a predetermined area of the top magnetic layer. Using the photoresist pattern 7 as a mask, the top magnetic layer, the tunnel barrier layer and the bottom magnetic layer are successively etched to form a lower magnetic pattern 3, a tunnel barrier pattern 4 and an upper magnetic pattern 5, which are stacked in the order recited. In this instance, the etching process employed is a reactive-ion etching (RIE) process. The lower magnetic pattern 3 includes a magnetic substance whose magnetization direction is pinned, while the upper magnetic pattern 5 includes a magnetic substance whose magnetization direction is variable. The tunnel barrier pattern 4 includes an insulating substance.

During the RIE process, etch residues 8 may be produced at a sidewall of a MTJ pattern. The etch residues may not be easily removed. Since the upper magnetic pattern 5 may conventionally include nickel iron ($Ni_xFe_y$) or cobalt ion ($Co_xFe_y$), the etch residues 8 may contain iron, nickel or cobalt. Thus, the etch residues 8 may contribute to an electrical short circuit with respect to the upper and lower magnetic patterns 3 and 5, respectively. Consequently, intrinsic properties of the MTJ pattern may be altered resulting in a malfunction of the magnetic memory device.

Attempts have been made in an effort to resolve the problems noted above. One such attempt is described with reference to FIG. 2 and FIG. 3.

FIG. 2 and FIG. 3 present cross-sectional views illustrating a modified conventional method of forming an MTJ pattern of a magnetic memory device. Specifically referring to FIG. 2 and FIG. 3, an insulation layer 11 is formed on a semiconductor substrate 10. A bottom magnetic layer 12, a tunnel barrier layer 13, and a top magnetic layer 14 are sequentially formed on the insulation layer 11. A photoresist pattern 15 is formed on a predetermined area of the top magnetic layer 14. Using the photoresist pattern 15 as a mask, the upper magnetic pattern 15 is etched in a direction toward a top surface of the tunnel barrier layer 13 to form an upper magnetic pattern 14a.

Although not shown in the referenced figures, as understood by one of ordinary skill in the art, after the photoresist pattern 15 is removed, the tunnel barrier layer 13 and the bottom magnetic layer 12 are successively patterned to form a lower magnetic pattern and a tunnel barrier pattern, which are stacked in the order recited. Due to, at least in part, the photoresist pattern being formed using the patterning process, the upper magnetic pattern 14a may be protected.

According to the modified method, the upper magnetic pattern 14a is formed using the tunnel barrier layer 13 as an etch-stop layer. When the lower magnetic pattern is formed, the upper magnetic pattern 14a may be protected to prevent a short between the lower magnetic pattern and the upper magnetic pattern 14a.

Etching the top magnetic layer 14 may be accomplished by employing an RIE process. In the some instances, the thickness of the tunnel barrier layer 13 may be unsuitable for its use as an etch-stop layer. More specifically, the tunnel barrier layer 13 may suffer from plasma damage and/or physical damage, at least in part, because of the RIE process. Thus, the lower magnetic pattern and the upper magnetic pattern 14a may be shorted and it may be less likely to achieve reproducibility of the RIE process. In an attempt to overcome the disadvantages described above, the top magnetic layer 14 may be etched using a wet etch.

An etchant solution including dicarboxylic acid is described in U.S. Pat. No. 6,426,012 to O'Sullivan et al. (hereinafter, "O'Sullivan"). According to O'Sullivan, a top magnetic film layer including nickel iron ($Ni_xFe_y$) or cobalt iron ($Co_xFe_y$) is etched using a wet etch process employing the etchant solution including dicarboxylic acid. The dicarboxylic acid is, for example, glutaric acid, adipic acid or suberic acid. However, the described etchant solution may not be capable of etching the nickel iron ($Ni_xFe_y$) or cobalt iron ($Co_xFe_y$) to the extent desired for the manufacturing processes described herein.

SUMMARY OF THE INVENTION

Embodiments of the present invention provide etchant solutions having desirable etching characteristics relative to a magnetic layer in a magnetic memory device and methods of forming a magnetic memory device that includes using the etchant solution. Embodiments of the present invention further provide etchant solutions that may prevent a related short phenomenon from occurring in a magnetic tunnel junction (MTJ) pattern and methods of forming a magnetic memory device using the etchant solution. Moreover, embodiments of the present invention provide etchant solutions having a desirable etch selectivity between a magnetic layer and a tunnel barrier layer and methods of forming a magnetic memory device using the etchant solution.

In some embodiments, the present invention provides etchant solutions including deionized water and an organic acid having a carboxyl radical and a hydroxyl radical, wherein the etchant solution includes about 0.05 to 50 weight percent organic acid relative to the deionized water. In some embodiments, the etchant solution comprises an oxidant.

In some embodiments, the present invention provides methods of forming a magnetic memory device including forming a magnetic layer on a substrate and etching the magnetic layer using an etchant solution including deionized water and organic acid, wherein the organic acid has a carboxyl radical and a hydroxyl radical.

In some embodiments, the present invention provides methods of forming a magnetic memory device including forming a bottom magnetic layer, a tunnel barrier layer, and a top magnetic layer on a substrate; forming a mask pattern on a predetermined area of the top magnetic layer; and using an etchant solution including deionized water and organic acid to etch in a direction from the top magnetic layer toward a top surface of the tunnel barrier layer to form a top magnetic pattern, wherein the organic acid includes a carboxyl radical and a hydroxyl radical. In some embodiments, methods of forming a magnetic memory device further include removing the mask pattern after forming the top magnetic pattern; forming a capping insulation layer on an entire surface of the substrate; and patterning the capping insulation layer, the tunnel barrier layer, and the bottom magnetic layer to form a bottom magnetic pattern, a tunnel barrier pattern and a capping insulation pattern, wherein the capping insulation pattern covers a top surface and sidewalls of the top magnetic pattern, and wherein plane areas of (a) the bottom magnetic pattern and (b) the tunnel barrier pattern are greater relative to a plane area of the top magnetic pattern.

In some embodiments, the present invention provides methods of forming a magnetic memory device including forming a bottom magnetic layer, a tunnel barrier layer and a top magnetic layer on a substrate; forming a mask pattern on a predetermined area of the top magnetic layer; anisotropically etching the top magnetic layer, the tunnel barrier layer, and the bottom magnetic layer to form a bottom magnetic pattern, a tunnel barrier pattern, and a top magnetic pattern; etching at least the top magnetic pattern using an etchant solution including deionized water and organic acid, wherein the organic acid includes a carboxyl acid and a hydroxyl acid; and removing the mask pattern.

DETAILED DESCRIPTION OF EMBODIMENTS ACCORDING TO THE INVENTION

Figure 1:
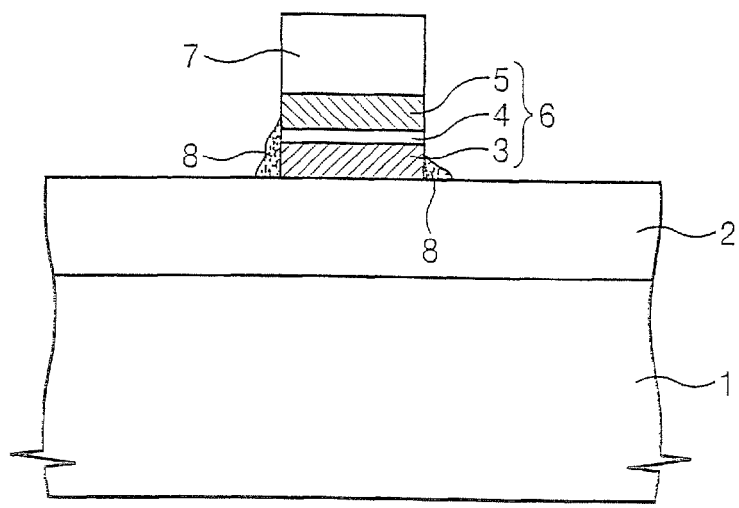
FIG. 1 presents a cross-sectional view illustrating a conventional method of forming a magnetic tunnel junction pattern in a magnetic memory device.
Figure 2:
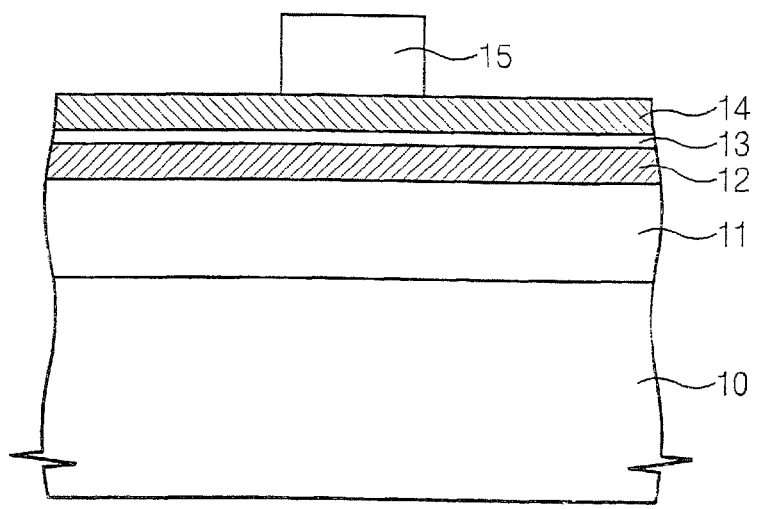
FIG. 2 and FIG. 3 present cross-sectional views illustrating another conventional method of forming a magnetic tunnel junction pattern in a magnetic memory device.
Figure 3:
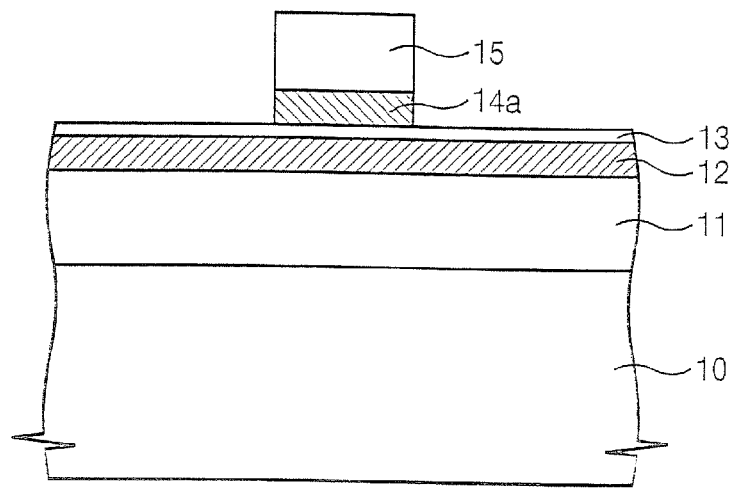

The present invention will now be described more fully hereinafter with reference to the accompanying drawings, in which various embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise. Also, as used herein, "and/or" refers to and encompasses any and all possible combinations of one or more of the associated listed items.

Unless otherwise defined, all terms, including technical and scientific terms used in the description of the invention, have the same meaning as commonly understood by one of ordinary skill in the art to which this invention belongs. All publications, patent applications, patents, and other references mentioned herein are incorporated by reference in their entirety.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present invention.

In the drawings, the thickness of layers and regions are exaggerated for clarity. It will also be understood that when a layer is referred to as being "on" another layer or substrate or a reactant is referred to as being introduced, exposed or fed "onto" another layer or substrate, it can be "directly on" the other layer, or substrate, or intervening layers can also be present. However, when a layer, region or reactant is described as being "directly on" or introduced, exposed or fed "directly onto" another layer or region, no intervening layers or regions are present. Additionally, like numbers refer to like compositions or elements throughout.

Embodiments of the present invention are further described herein with reference to cross-section illustrations that are schematic illustrations of idealized embodiments of the present invention. As such, variations from the shapes of the illustrations as a result, for example, of manufacturing techniques and/or tolerances, are to be expected. In particular, the regions illustrated in the figures are schematic in nature and their shapes are not intended to illustrate the precise shape of a region of a device and are not intended to limit the scope of the present invention.

As will be appreciated by one of ordinary skill in the art, the present invention may be embodied as compositions and devices including the compositions as well as methods of making and using such compositions and devices.

Figure 4:
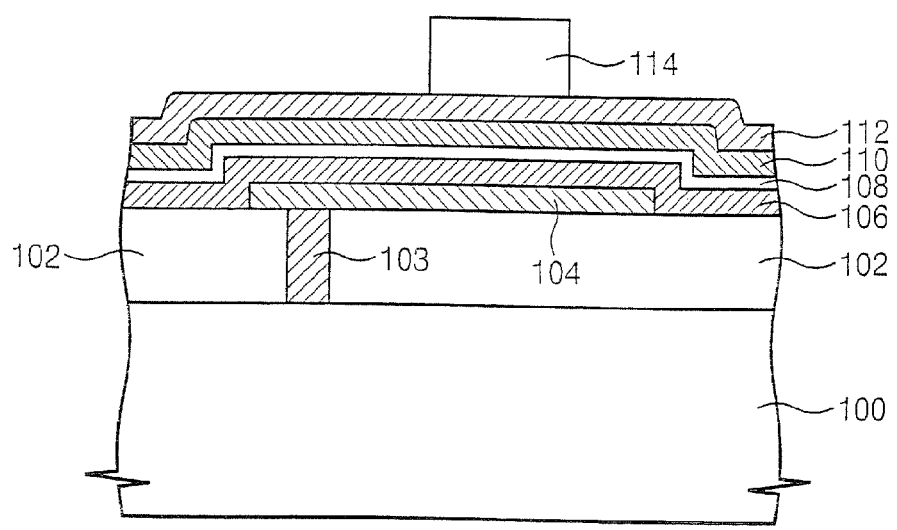
FIG. 4 through FIG. 8 present cross-sectional views illustrating methods of forming a magnetic memory device according to some embodiments of the present invention.

According to some embodiments, the present invention provides methods of forming a magnetic memory device. Referring to FIG. 4, an insulation layer 102 is formed on a semiconductor substrate 100 (hereinafter, "substrate"). A conductive plug 103 is formed to contact a predetermined area of the substrate 100 through the insulation layer 102. A source/drain region of a MOS transistor may be disposed in a substrate 100 that contacts the conductive plug 103. The source/drain region of the MOS transistor acts as a switching element. The insulation layer 102 may include silicon oxide or other suitable insulating substances. The conductive plug 103 may include tungsten or doped polysilicon.

Prior to formation of the insulation layer 102, a lower interlayer dielectric is interposed to form a digit line disposed on the substrate 100. A lower electrode 104 is formed on the insulation layer 102 to be electrically connected to the conductive plug 103. A bottom magnetic layer 106, a tunnel barrier layer 108, a top magnetic layer 110, and an upper electrode layer 112 are sequentially formed on an entire surface of a substrate including the lower electrode 104.

The bottom magnetic layer 106 includes a magnetic substance whose magnetization direction is pinned. The bottom magnetic layer 106 may include a pinning layer and a pinned layer. A magnetization direction of the pinned layer is pinned by the pinning layer. The pinning layer may include, for example, IrMn, PtMn, MnO, MnS, MnTe, $MnF_2$, $FeF_2$, Ru and combinations thereof. The pinned layer may include, for example, Fe, Co, Ni, $Ni_xFe_y$, $Co_xFe_y$ and combinations thereof. The bottom magnetic layer 106 may include the pinning layer and the pinned layer which may be iteratively stacked. The bottom magnetic layer 106 may further include a seed layer that is a lowest layer and may include $Ni_xFE_y$ or $Ni_xFe_yCr_z$. The tunnel barrier layer 108 may include an insulating substance such as, for example, aluminum oxide ($Al_2O_3$), titanium oxide ($TiO_2$), magnesium oxide (MgO), silicon oxide ($SiO_2$), aluminum nitride (AlN) and combinations thereof. The top magnetic layer 110 includes a magnetic substance whose magnetization direction may vary with an applied electric field. The top magnetic layer 110 includes Fe, Co, Ni, $Ni_xFe_y$, $Co_xFe_y$ and combinations thereof. In some embodiments, x+y=100 and x+y+z=100.

According to some embodiments, the lower electrode 104 includes a conductive substance having an etch selectivity with respect to the bottom magnetic layer 106. The lower electrode 104 may include, for example, titanium, tantalum, titanium nitride, tantalum nitride, titanium aluminum nitride and combinations thereof. The upper electrode layer 112 includes a conductive substance having an etch selectivity with respect to the bottom magnetic layer 106, the tunnel barrier layer 108 and the top magnetic layer 110. The upper electrode layer 112 may include, for example, titanium, tantalum, titanium nitride, tantalum nitride, titanium aluminum nitride and combinations thereof. Alternatively, the upper electrode layer 112 may be omitted in some embodiments. A mask pattern 114 may be formed on a predetermined area of the upper electrode layer 112. The mask pattern 114 may be a photoresist pattern or a hard mask pattern.

Figure 5:
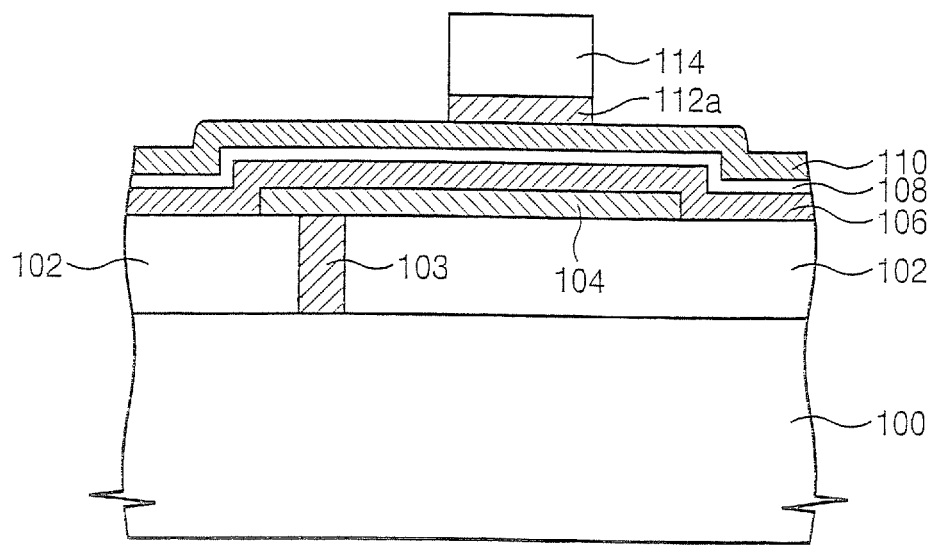
Figure 6:
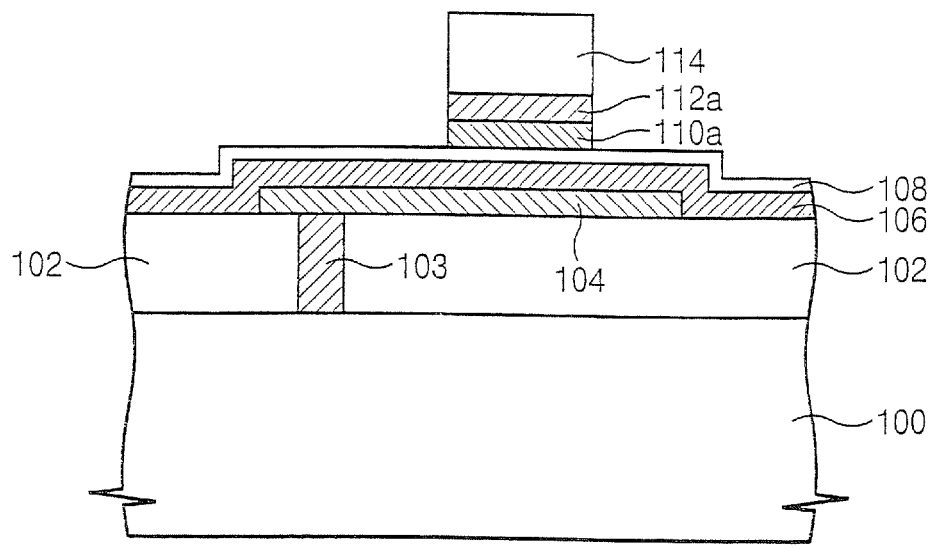

Referring to FIG. 5 and FIG. 6, using the mask pattern 114 as an etch mask, the upper electrode layer 112 is etched in a direction toward a top surface of the top magnetic layer 110 to form an upper electrode 112a. Using an etchant solution, the top magnetic layer 110 is etched in a direction toward a top surface of the tunnel barrier layer 108 to form a top magnetic pattern 110a.

According to some embodiments, the etchant solution includes deionized (DI) water and organic acid. The organic acid includes a carboxyl radical (—COOH) and a hydroxyl radical (—OH). Due to the nature of the carboxyl radical and hydroxyl radical, the organic acid may be readily dissociated to increase the acid strength of the etchant solution. Thus, the etchant solution may have a desirable etching characteristic relative to the top magnetic layer 110. More specifically, the etchant solution may have an enhanced etching characteristic relative to various substances such as nickel (Ni), cobalt (Co), iron (Fe), nickel iron ($Ni_xFe_y$) or cobalt iron ($Co_xFe_y$). Accordingly, the top magnetic layer 110 may include various substances. The tunnel barrier layer 108 may be passivated by the reaction of the carboxyl radical and hydroxyl radical. That is, the etchant solution may protect the tunnel barrier layer 108. In this regard, the etchant solution may have an enhanced etch selectivity with respect to the top magnetic layer 110 and the tunnel barrier layer 108.

In some embodiments, the numerical index of acid dissociation constant (pKa) of the organic acid is in a range from about 2-4. As used herein, the "pKa" is a log scale of the acid dissociation constant (Ka). In some embodiments, the organic acid includes at least one acid, for example, citric acid ($C_6H_8O_7$), tartaric acid ($C_4H_6H_6$) or malic acid ($C_4H_6O_5$).

In some embodiments, the etchant solution comprises about 0.05 to 50 weight percent (w/w) organic acid relative to the deionized water. In some embodiments, the etchant solution comprises about 0.05 to 35 weight percent (w/w) organic acid relative to the deionized water. In other embodiments, the etchant solution comprises about 0.15 to 35 weight percent organic acid relative to the deionized water. In some embodiments, the etchant solution includes about 0.05 weight percent carboxyl radical and about 35 weight percent hydroxyl radical. Thus, an etch rate of the top magnetic layer 100 using the etchant solution may be controlled.

In some embodiments, the etchant solution further includes an oxidant for oxidizing the top magnetic layer 110. Inclusion of the oxidant in the etchant solution may increase the etch amount of the top magnetic layer 110. In some embodiments, the range of the weight percent of the oxidant is from about 0.1 to 20 relative to deionized water. In some embodiments, the oxidant may be $KIO_3$ or $NH_4IO_3$. Although the etchant solution includes an oxidant, it may passivate the tunnel barrier layer 108.

In some embodiments, the etch process using the etchant solution may be performed at a temperature in a range from about 10 to 100 degrees centigrade.

Referring to FIG. 6, the top magnetic pattern 110a is aligned to a sidewall of the mask pattern 114. However, a sidewall of the top magnetic pattern 110a may be etched to a lesser extent because an etch process using the etchant solution may be an isotropic etch process. Since it may be desirable to form a top magnetic layer 110 of decreased thickness, the etch amount may be minimal.

Figure 7:
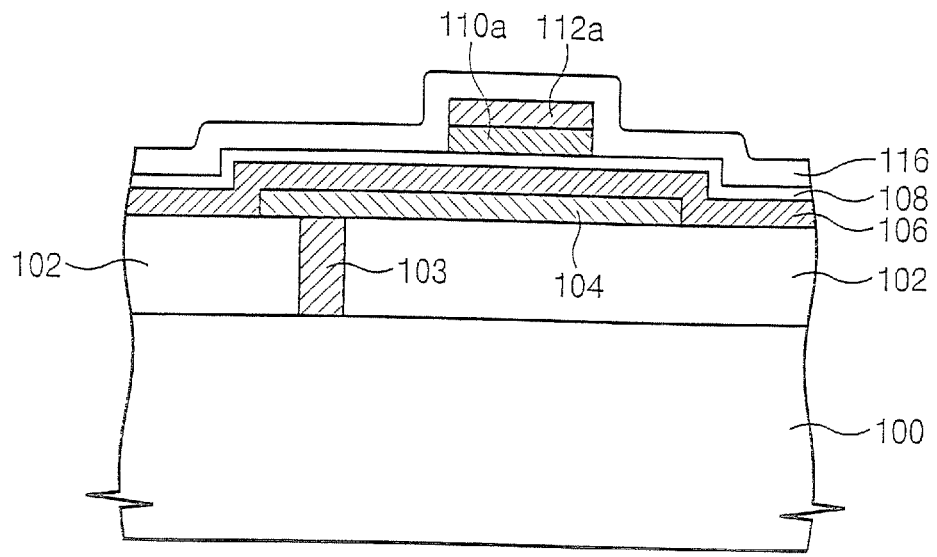

Referring to FIG. 7, the mask pattern 114 is removed. A capping insulation layer 116 is formed on an entire surface of a substrate 100 where the mask pattern 114 is removed. The capping insulation layer 116 may include silicon oxide, silicon nitride, silicon oxynitride, aluminum oxide, titanium oxide and combinations thereof.

Figure 8:
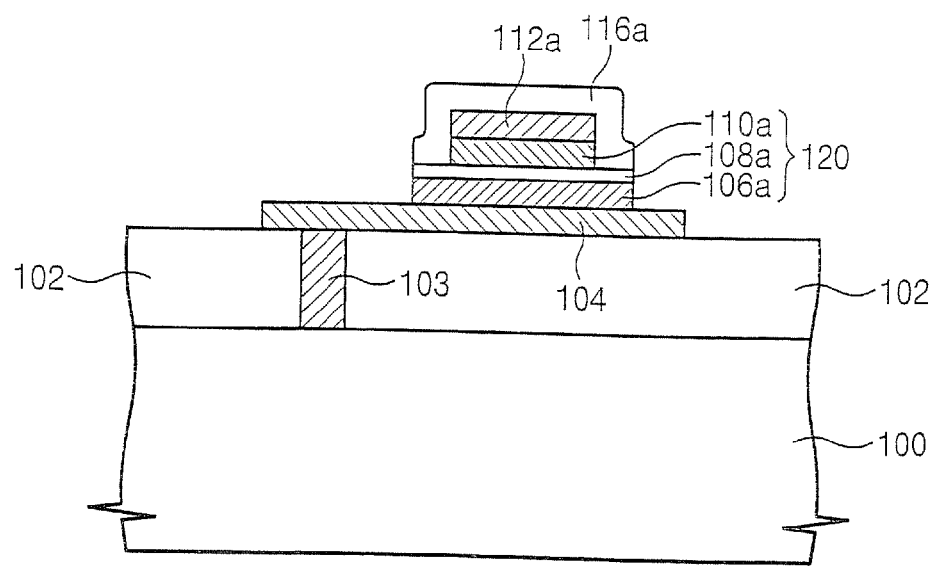

Referring to FIG. 8, the capping insulation layer 116, the tunnel barrier layer 108 and the bottom magnetic layer 106 are successively patterned to form a bottom magnetic pattern 106a, a tunnel barrier pattern 108a and a capping insulation pattern 116a which are sequentially stacked on a predetermined area of the lower electrode 104. As described above, the lower electrode 104 may have an etch selectivity with respect to the bottom magnetic layer 106. The bottom magnetic pattern 106a and the tunnel barrier pattern 108a are disposed below the top magnetic pattern 110a. Plane areas of the bottom magnetic pattern 106a and the tunnel barrier pattern 108a may have larger than a plane area of the top magnetic pattern 110a, respectively. The bottom magnetic pattern 106a, the tunnel barrier pattern 108a, and the top magnetic pattern 110a constitute a MTJ pattern 120. The capping insulation pattern 116a may cover the sidewalls of the top magnetic pattern 110a, the upper electrode 112a and a top surface of the upper electrode 112a.

According to the foregoing, the top magnetic pattern 110a may be formed using the etchant solution to prevent production of etch residues that may result from employing a conventional RIE process. Thus, a conventional short phenomenon may be suppressed.

The etchant solution may have enhanced etching characteristics relative to various magnetic substances. Thus, the top magnetic layer 110 may be more readily etched and may include various magnetic substances.

Due to the enhanced etch selectivity of the etchant solution, the top magnetic layer 110 may be selectively etched even if the tunnel barrier layer 108 is very thin.

The bottom magnetic pattern 106a and the tunnel barrier layer 108a may be formed to be larger than the top magnetic pattern 110a, so that a sidewall of the bottom magnetic pattern 106a is spaced farther away from a sidewall of the top magnetic pattern 106 in an effort to prevent a short between the bottom and top magnetic patterns 106a and 110a.

Before etching the tunnel barrier layer 10' and the bottom magnetic layer 106, the capping insulation pattern 116a may cover both sidewalls and a top surface of the top magnetic pattern 11a to reduce or prevent a short between the bottom and top magnetic patterns 106a and 110a.

In some embodiments, an upper interlayer dielectric may be formed to cover an entire surface of the resultant structure. A bitline may be formed on the upper interlayer dielectric. The digit line may be disposed below the MTJ pattern 120, and the bitline may be disposed thereover. The bitline crosses the digit line. The bitline may be electrically connected to a top surface of the upper electrode 112a through a contact hole penetrating the upper interlayer dielectric and the capping insulation pattern 116a.

Figure 9:
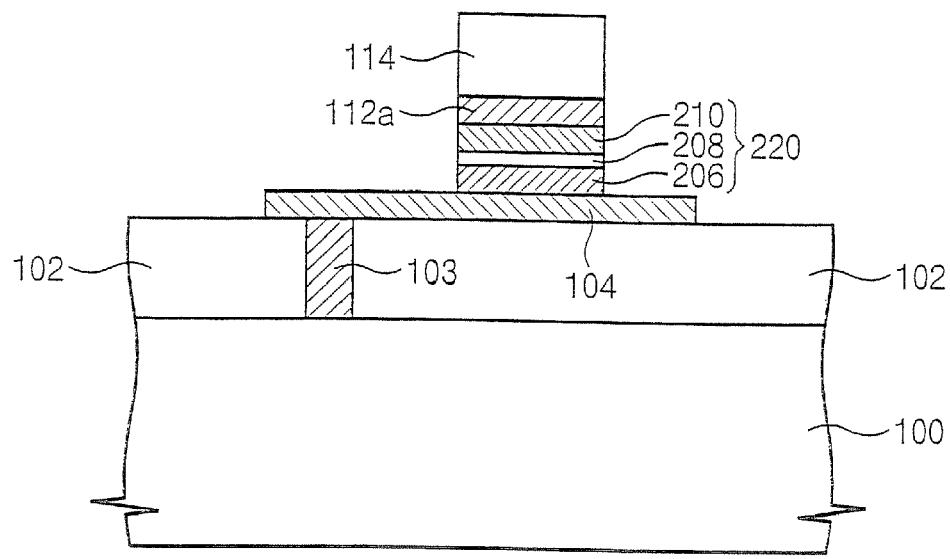
FIG. 9 and FIG. 10 present cross-sectional views illustrating methods of forming a magnetic memory device according to some embodiments of the present invention.
Figure 10:
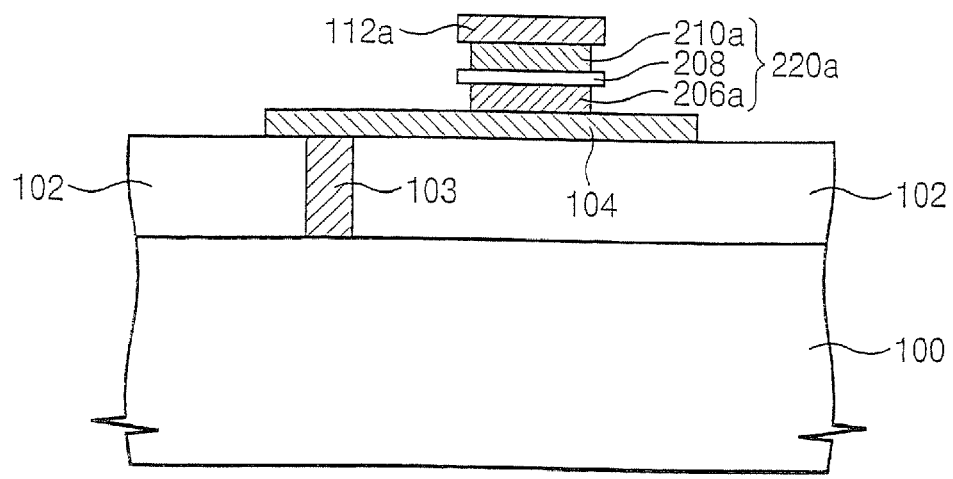

Methods of forming a magnetic memory device according to some embodiments of the present invention can be described in reference to FIG. 9 and FIG. 10 and may include the methods described previously with reference to FIG. 4. More specifically, FIG. 9 and FIG. 10 present cross-sectional views illustrating methods of forming a magnetic memory device. In particular, an insulation layer 102 is disposed on a substrate 100. A lower electrode 104 is disposed on the insulation layer 102. The lower electrode 104 is electrically connected to a conductive plug 103, which is connected to the substrate 100, through the insulation layer 102.

A bottom magnetic layer 106, a tunnel barrier layer 108, a top magnetic layer 110 and an upper electrode layer 112 are sequentially stacked on an entire surface of a substrate 100 having the lower electrode 104. A mask pattern 114 is disposed on the upper electrode layer 112. The above components may be formed using the same procedures previously described.

Using the mask pattern 114 as an etch mask, the upper electrode layer 112, the top magnetic layer 110, the tunnel barrier layer 108 and the bottom magnetic layer 106 are successively anisotropically etched to form a bottom magnetic pattern 206, a tunnel barrier pattern 208, a top magnetic pattern 210 and an upper electrode 116a, which are sequentially stacked on a predetermined area of the lower electrode 104. The bottom magnetic pattern 206, the tunnel barrier pattern 208 and the top magnetic pattern 210 constitute a MTJ pattern 220.

Referring to FIG. 10, at least the top magnetic pattern 210 is etched using an etchant solution including organic acid having a carboxyl radical and a hydroxyl radical. Thus, the etching may be initiated from a sidewall of the magnetic pattern 210a to form an under-cut area at both sides of the etched magnetic pattern 210a. The etchant solution is described in detail above.

In some embodiments, if the upper magnetic pattern 210 is etched using the etchant solution, the tunnel barrier pastern 208 may be passivated by the etchant solution to protrude laterally as compared with the etched top magnetic pattern 210a. Since the bottom magnetic pattern 206 may contain nickel (Ni), iron (Fe), cobalt (Co), nickel iron ($Ni_xFe_y$), and cobalt iron ($Co_xFe_y$), the bottom magnetic pattern 206 may also be etched using the etchant solution. Accordingly, an under-cut area may be formed at both sides of the etched bottom magnetic pattern 206a. The tunnel barrier pattern 208 may protrude laterally as compared with the etched bottom magnetic pattern 206a.

In some embodiments, the etch process using the etchant solution may be followed by removal of the mask pattern 114, and optionally, subsequent etching. Reference numeral 210a denotes a magnetic tunnel junction pattern (MTJ pattern) including the etched top magnetic pattern.

In some embodiments, an upper interlayer dielectric may be formed to cover an entire surface of the resultant structure, and a bitline may be formed on the upper interlayer dielectric to be connected to the upper electrode 112a.

According to some embodiments, in methods of forming a magnetic memory device, an under-cut area may be formed at both sides of the etched top magnetic pattern 210a by the etch process using the etchant solution. Thus, although etch residues may be produced at both sides of the MTJ pattern 210, they may be removed. Additionally, since the bottom magnetic pattern 206 may also be removed using the etchant solution, an under-cut area may also be formed at both sides of the bottom magnetic pattern 206a. Thus, in some embodiments, the etch residues may be more readily removed.

In some embodiments, the tunnel barrier pattern 208 may protrude laterally as compared with the etched top magnetic pattern 210a. Accordingly, a sidewall of the etched top magnetic pattern 210a may be spaced a distance away from a sidewall of the bottom magnetic pattern 206 in an effort to prevent a short which may be associated with a conventional process of producing the same. In some embodiments, if the bottom magnetic pattern 206 is etched using the etchant solution, the tunnel barrier pattern 208 may protrude as compared with the sidewall of the etched bottom magnetic pattern 206a. Thus, the sidewalls of the etched bottom and top magnetic patterns 206a and 210a may be spaced farther apart from each other in an effort to prevent the conventional short phenomenon.

As previously described, an etchant solution according to some embodiments of the present invention include deionized water and organic acid having a carboxyl radical and a hydroxyl radical. Since the etchant solution may have enhanced etching characteristics relative to a magnetic layer used in a magnetic memory device, the magnetic layer may be etched more efficiently. Further, the etchant solution may have enhanced etching characteristics relative to various magnetic substances. The etchant solution may passivate the substrate, and thus, contribute to enhanced etch selectivity between the magnetic layer and the tunnel barrier layer. Consequently, although the tunnel barrier layer may have a decreased thickness, the magnetic layer may be etched by the etchant solution using the tunnel barrier layer as an etch-stop layer.

EXAMPLE

Table 1 presented below shows data obtained from a test of a magnetic layer etched using a conventional etchant solution disclosed in U.S. Pat. No. 6,426,012 and an etchant solution according to some embodiments of the present invention.

TABLE 1

|  |  | Nickel Iron | | Cobalt Iron | |
| --- | --- | --- | --- | --- | --- |
|  |  | pre-etch thickness | post-etch thickness | pre-etch thickness | post-etch thickness |
| Conventional Art | 1st sample (adipic acid) | 190Å | 190Å | 180Å | 180Å |
|  | 2nd sample (suberic acid) | 190Å | 190Å | 180Å | 180Å |
|  | 3rd sample (glutaric acid) | 190Å | 190Å | 180Å | 100Å |
| Present Invention | 4th sample (citric acid) | 190Å | 110Å | 180Å | 0Å |

In Table 1, the first through third samples represent conventional etchant solutions and the fourth sample represents an etchant solution according to some embodiments of the present invention.

In the respective samples, deionized (DI) water and each acid were mixed. Weight percents of acids in the DI water were equal to each other. Specifically, the first sample included adipic acid of 5 weight percent; the second sample included suberic acid of 5 weight percent; the third sample included glutaric acid of 5 weight percent; and the fourth sample included citric acid of 5 weight percent. A magnetic layer was formed of nickel iron and cobalt iron and subjected to an etching process for 10 minutes.

As demonstrated in Table 1, the first and second samples did not etch the nickel iron and cobalt iron. Although the test was performed while changing the acids of the first and second samples within a range from 1 weight percent to 10 weight percent by 1 weight percent, the first and second samples did not etch the nickel iron and cobalt iron at any point within the range. Further, the third sample did not etch the nickel iron to a significant extent. Although the test was performed while changing the glutaric acid within a range from 1 weight percent to 10 weight percent by 1 weight percent, the third sample did not etch the nickel iron to a significant extent at any point within the range. However, the third sample partially etched the cobalt iron.

The fourth sample etched the nickel iron by as much as 80 angstroms and the cobalt iron by as much as 180 angstroms, i.e., the cobalt iron was significantly, if not completely, etched. In other words, the fourth sample exhibited enhanced etching characteristics relative to nickel iron as well as cobalt iron. Further, another test was performed in which an aluminum oxide layer having a thickness of 12 angstroms was etched using the fourth sample for 10 minutes. The fourth sample did not etch the aluminum oxide layer to a significant extent. Thus, the fourth sample exhibited enhanced etch selectivity with respect to the top magnetic layer 110 and the tunnel barrier layer 108.

As a result, the etchant solution according to some embodiments of the present invention possess enhanced etching characteristics relative to the top magnetic layer 110. Therefore, a variety of magnetic substances for use as the top magnetic layer 110 may be selected. Additionally, the etchant solution exhibited an enhanced etch selectivity with respect to the top magnetic layer 110 and the tunnel barrier layer 108. Therefore, a tunnel barrier layer 108 having a decreased thickness may act as an etch-stop layer while the top magnetic layer 110 is etched using an etchant solution according to some embodiments of the present invention.

Although the present invention has been described with reference to embodiments thereof, it will be understood that the invention is not limited to the details thereof. Various substitutions and modifications have been suggested in the foregoing description, and others may occur to those of ordinary skill in the art. Therefore, all such substitutions and modifications are intended to be embraced within the scope of the invention as recited in the claims.

What is claimed is:

1. A method of forming a magnetic memory device, comprising:
    forming a bottom magnetic layer, a tunnel barrier layer and a top magnetic layer on a substrate;
    forming a mask pattern on a predetermined area of the top magnetic layer;
    using an etchant solution comprising deionized water and organic acid to etch in a direction from the top magnetic layer toward a top surface of the tunnel barrier layer to form a top magnetic pattern, wherein the organic acid comprises a carboxyl radical and a hydroxyl radical;
    removing the mask pattern after forming the top magnetic pattern;
    forming a capping insulation layer on an entire surface of the substrate; and
    patterning the capping insulation layer, the tunnel barrier layer, and the bottom magnetic layer to form a bottom magnetic pattern, a tunnel barrier pattern, and a capping insulation pattern,
    wherein the capping insulation pattern covers a top surface and sidewalls of the top magnetic pattern, and wherein plane areas of (a) the bottom magnetic pattern and (b) the tunnel barrier pattern are greater relative to a plane area of the top magnetic pattern.

2. The method of claim 1, wherein the organic acid comprises citric acid, malic acid or tartaric acid.

3. The method of claim 1, wherein the organic acid has a weight percent in a range of about 0.05 to 35 relative to the deionized water.

4. The method of claim 3, wherein the organic acid has an acid dissociation constant (pKa) in a range of about 2 to 4.

5. A method of forming a magnetic memory device, comprising:
    a bottom magnetic layer, a tunnel barrier layer and a top magnetic layer on a substrate;
    forming a mask pattern on a predetermined area of the top magnetic layer;

anisotropically etching the top magnetic layer, the tunnel barrier layer, and the bottom magnetic layer to form a bottom magnetic pattern, a tunnel barrier pattern, and a top magnetic pattern;

after forming the bottom magnetic pattern, the tunnel barrier pattern and the top magnetic pattern, etching at least the top magnetic pattern using an etchant solution comprising deionized water and organic acid, wherein the organic acid comprises a carboxyl radical and a hydroxyl radical; and removing the mask pattern.

6. The method of claim 5, wherein the organic acid has a weight percent in a range of about 0.05 to 35 relative to the deionized water.

7. The method of claim 5, wherein the organic acid has an acid dissociation constant (pKa) in a range of about 2 to 4.

8. The method of claim 5, wherein the organic acid comprises citric acid, malic acid or tartaric acid.

9. The method of claim 5, wherein the magnetic layer comprises nickel (Ni), iron (Fe), cobalt (Co), nickel iron ($Ni_xFe_y$), cobalt iron ($Co_xFe_y$) or combinations thereof.

10. The method of claim 5, wherein the etchant solution further comprises an oxidant.

11. The method of claim 10, wherein the oxidant has a weight percent in a range of about 0.1 to 20 relative to the deionized water.

* * * * *